United States Patent [19]
Nariman et al.

[11] Patent Number: 6,157,081
[45] Date of Patent: Dec. 5, 2000

[54] HIGH-RELIABILITY DAMASCENE INTERCONNECT FORMATION FOR SEMICONDUCTOR FABRICATION

[75] Inventors: Homi E. Nariman; H. Jim Fulford, Jr., both of Austin, Tex.

[73] Assignee: Advanced Micro Devices, Inc., Sunnyvale, Calif.

[21] Appl. No.: 09/265,193

[22] Filed: Mar. 10, 1999

[51] Int. Cl.[7] .......................... H01L 23/48; H01L 23/52; H01L 29/40
[52] U.S. Cl. ..................... 257/752; 257/251; 257/622
[58] Field of Search ................... 257/751, 752, 257/763, 764, 520, 624, 622

[56] References Cited

U.S. PATENT DOCUMENTS

| | | |
|---|---|---|
| 5,262,354 | 11/1993 | Cote et al. . |
| 5,278,449 | 1/1994 | Miyakawa . |
| 5,300,813 | 4/1994 | Joshi et al. . |
| 5,581,110 | 12/1996 | Razouk et al. . |
| 5,686,760 | 11/1997 | Miyakawa . |
| 5,714,418 | 2/1998 | Bai et al. . |
| 5,793,112 | 8/1998 | Hasegawa et al. . |
| 5,889,328 | 8/1999 | Joshi et al. . |
| 5,939,788 | 8/1999 | McTeer . |

FOREIGN PATENT DOCUMENTS

| | | |
|---|---|---|
| 0 788 156 | 8/1997 | European Pat. Off. . |
| 0 881 673 | 12/1998 | European Pat. Off. . |

OTHER PUBLICATIONS

Steigerwald et al., *Chemical Mechanical Planarization of Microelectronic Materials*, John Wiley & Sons 1997, pp. 188–189 and 206–207.

*Primary Examiner*—Sheila V. Clark
*Attorney, Agent, or Firm*—Kevin L. Daffer; Conley, Rose & Tayon

[57] ABSTRACT

A high-reliability damascene interconnect structure and a method for forming the same are provided. An interlevel dielectric is formed over a semiconductor topography, and trenches for interconnects and/or vias are formed in the interlevel dielectric. A trench liner may then be deposited, followed by deposition of a low-resistance metal such as copper. The low-resistance metal deposition is preferably stopped before the trenches are entirely filled. Portions of the metal and trench liner external to the trenches are subsequently removed, such that low-resistance metal interconnect portions are formed. A high-melting-point metal, such as tungsten, is deposited over upper surfaces of the interconnect portions and interlevel dielectric. Portions of the high-melting-point metal are removed to form interconnects having a low-resistance metal lower portion and a high-melting-point metal upper portion. In one embodiment, the extrusion-prone lowresistance metal is removed from the vicinity of a ready extrusion path between the interlevel dielectric and an overlying dielectric. In another embodiment, the overlying metal is believed to prevent extrusion of the low-resistance metal by bonding with the low-resistance metal and by altering the electric field distribution between adjacent interconnects.

20 Claims, 6 Drawing Sheets

HIGH-RELIABILITY DAMASCENE INTERCONNECT FORMATION FOR SEMICONDUCTOR FABRICATION

BACKGROUND OF THE INVENTION

1. Field of the Invention

This invention relates to integrated circuit fabrication and, more particularly, to damascene interconnects exhibiting reduced short circuit formation and a method for fabricating these interconnects.

2. Description of the Relevant Art

Fabrication of an integrated circuit involves numerous processing steps. To form a metal-oxide-semiconductor (MOS) integrated circuit, for example, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. Such transistors are connected to each other and to terminals of the completed integrated circuit using conductive interconnect lines. Typically, multiple levels of interconnect are needed to provide the connections necessary for a modern, high-transistor-density IC.

A pervasive trend in modem integrated circuit manufacture is to produce transistors having feature sizes as small as possible. Many modem day processes employ features, such as gate conductors and interconnects, which have less than 0.3 μm critical dimension. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area.

This trend toward reduced feature sizes imposes severe demands on many aspects of IC fabrication, including interconnect formation. For example, narrower interconnects have reduced cross-sectional area, which results in a higher interconnect resistance for a given interconnect material. This interconnect resistance, along with the capacitance of the interconnect with respect to ground and other interconnects, contributes to an RC time constant which characterizes delays associated with propagation along the interconnect line. Fabrication of a circuit with increased RC time constants lowers the speed at which the circuit can operate by increasing the time needed, for example, for a circuit output voltage to respond to a change in input voltage. Although there are other parasitic resistances and capacitances in an integrated circuit, such as those associated with the transistors themselves, in modem circuits having submicron feature sizes interconnects may contribute as much as 80% of the total circuit delay time. The increased interconnect resistance described above places a limit on how narrow interconnect lines can be and maintain tolerable interconnect resistance. The greater the resistivity of the interconnect material, the wider the lines must be, as discussed further below.

As feature size decreases and transistor density increases, multiple layers of interconnect must be used to connect the transistors to each other and to the terminals of the integrated circuit. The limitation discussed above on the narrowness of interconnect lines can exacerbate this need for multiple interconnect layers. Fabrication of each interconnect layer requires deposition and patterning processes, adding to the expense of the circuit and increasing the opportunity for defect incorporation and the resulting yield reduction. It is therefore desirable to minimize the number of interconnect layers required.

Lowering the resistivity of the interconnect material alleviates the interconnect-related problems discussed above. Resistance, R, along the length of a structure formed from a given material is related to the resistivity, ρ, of the material by R=ρl/A, where l is the length of the structure and A is its cross-sectional area. It can therefore be seen that lowering the resistivity of an interconnect material reduces the resistance of an interconnect line of a given cross-sectional area. Furthermore, a line formed from a lower-resistivity material could be made narrower before an unacceptable resistance level is reached than a line formed from a higher-resistivity material. This ability to form narrower lines may allow fewer interconnect levels to be used to form the required connections for an IC, thereby reducing costs and potentially increasing the yield of correctly-functioning circuits.

Advantages such as those described above of low-resistivity interconnect materials have driven a movement in the semiconductor industry toward replacing aluminum interconnects with interconnects made from copper. The resistivity of pure copper (about 1.7 $\mu\Omega$·cm) is significantly lower than that of pure aluminum (about 2.6 $\mu\Omega$·cm). Both aluminum and copper interconnects typically contain small concentrations of other elements to improve interconnect reliability. These added elements increase the resistivity of the metal, but practical copper interconnects still have resistivities up to 40% lower than those of practical aluminum interconnects. Copper interconnects can therefore be made narrower than aluminum interconnects for a given value of interconnect resistance. This may result in fewer levels of metallization being needed with copper interconnects. For a given interconnect cross-sectional area, copper interconnects exhibit lower resistances, and therefore shorter interconnect-related delays, than do aluminum interconnects.

Because copper is more difficult to etch than aluminum, in addition to difficulties in etching narrow features in metals in general as compared to etching of insulators, copper interconnects are generally formed using what is known as a damascene process. Instead of blanket-depositing a metal, which is then patterned into interconnect lines or vias (vertical connections between interconnect levels), and subsequently filling in the spaces between the lines or vias with an insulator for electrical isolation, interconnect formation using a damascene process involves patterning trenches corresponding to the desired interconnect geometry into a dielectric, and then filling the trenches with the interconnect metal.

A typical copper damascene process is illustrated in FIGS. 1–4. In the cross-sectional view of FIG. 1, via dielectric 12 is formed upon semiconductor topography 10. Semiconductor topography 10 includes a semiconductor substrate, preferably a silicon substrate, and may include transistors formed on and within the substrate, and one or more layers of interconnect. Via dielectric 12, typically formed from oxide, provides electrical isolation between semiconductor topography 10 and a layer of interconnect to be formed above via dielectric 12. Connections between topography 10 and this overlying interconnect layer are made by opening via trenches through via dielectric 12. Etch stop layer 14 and line dielectric 16 are formed above via dielectric 12.

The process of FIGS. 1–4 is specifically known as a "dual damascene" process, in which the same metal is used for vias and overlying interconnect lines, and both via and line dielectrics are deposited before trench formation and filling. In a single damascene process, on the other hand, vias are formed before deposition of a line dielectric and subsequent trench formation and filling to create interconnect lines. Vias and lines may be formed from different dielectrics in single damascene processes. Etch stop layer 14 is formed from a dielectric material which exhibits etch selectivity with respect to via dielectric 12 and line dielectric 16. For example, silicon nitride is often used for etch stop 14. Line dielectric 16 is often formed using a low-permittivity material, such as fluorine-doped oxide. The use of a low-permittivity material reduces capacitive coupling between closely spaced interconnect lines. Dielectrics 12 and 16 and etch stop 14 are typically deposited using chemical vapor deposition (CVD) techniques.

Patterning and etching are subsequently carried out to form trenches in line dielectric 16 and via dielectric 12. An example of the resulting trenches is shown in FIG. 2. Trench 18 includes a via trench extending through via dielectric 12 down to the upper surface of semiconductor 10, and an overlying interconnect line trench connected to topography 10 by this via trench. Trench 20 is for an interconnect line which does not have a via connection to topography 10 in the plane of the cross-section of FIG. 2. Trenches 18 and 20 are preferably formed using photolithographic patterning processes and anisotropic dry etching processes. There are several variations of patterning/etching sequences which may be used to form trenches 18 and 20. For example, line trenches such as trench 20 and the upper part of trench 18 may be patterned and etched first, followed by patterning and etching of via trenches, such as the lower part of trench 18. Alternatively, via trenches may be patterned and etched before line trenches, or, with appropriate patterning, both line and via trenches may be etched in one step. Although etch stop layers such as layer 14 are often used in dual damascene processes, it may be possible to form trenches such as trench 18 without using an etch stop layer. Furthermore, via dielectric 12 and line dielectric 16 may be formed from the same material in some dual damascene processes.

Copper (or another interconnect metal) is subsequently deposited to fill trenches 18 and 20, as shown in FIG. 3. Because copper diffuses readily through silicon and oxide, and undesirably alters the electrical properties of transistors formed in silicon, liner 22 is deposited into the trenches before deposition of copper layer 24. Liner 22 is preferably formed from a conductive material which acts as a diffusion barrier to the overlying copper, and also adheres well to dielectrics 12 and 16. Materials typically used for liner 22, which is often called a diffusion barrier and/or an adhesion layer, include metal nitrides such as titanium nitride and tantalum nitride, and refractory alloys such as titanium-tungsten. Copper layer 24 is typically formed using two deposition steps. A thin "seed" layer is deposited first, followed by a more rapid "fill" deposition. The seed layer is typically deposited by sputtering, but other methods such as CVD may also be used. Electroplating is a currently preferred method of depositing the copper fill layer, but other techniques, including CVD, may be used as well.

Portions of liner 14 and copper layer 24 external to trenches 18 and 20 are subsequently removed, as shown in FIG. 4. This removal is preferably accomplished using chemical-mechanical polishing (CMP), in which the upper surface of the wafer is polished using an abrasive polishing pad and a polishing fluid known as a slurry. Copper interconnects 26 (a line/via combination) and 28 (a line interconnect), shown in FIG. 4, result from this removal. Liner portions 27 and 29 underlie interconnects 26 and 28, respectively. The interconnect level containing interconnects 26 and 28 is typically covered by cap layer 30, which has a composition similar to that of etch stop layer 14. Cap layer 30 is an insulating film which provides a diffusion barrier to prevent copper from diffusing into an overlying dielectric.

A problem which can arise with damascene interconnect structures such as that of FIG. 4 is shown in FIG. 5. FIG. 5 is an expanded view of the area between interconnects 26 and 28 in FIG. 4. Copper "tails" 32 extend outward from interconnects 26 and 28, along the interface between line dielectric 16 and cap layer 30. Tails 32 result from "extrusion", a movement of copper atoms along the interface in response to an electric field applied between interconnects 26 and 28. Because connection points of an integrated circuit are at a variety of electrostatic potentials, potential differences, and associated electric fields, may often exist between adjacent interconnect lines. It is postulated that the interface between dielectric 16 and cap layer 30 provides a ready diffusion path for copper atoms, and that this diffusion may be aided by an electric field. Thermal expansions and contractions caused by subsequent processing and by heating of conductors during circuit operation may also contribute to extrusion of tails 32.

Extrusion is believed to be somewhat analogous to the electromigration which can occur in current-carrying metal lines, in which metal atoms move by diffusion along grain boundaries, the motion of the atoms being aided by collisions with the electrons constituting the current. As such, metals which tend to be susceptible to electromigration are believed to also be susceptible to extrusion, when used in structures which provide an interfacial diffusion path, such as damascene interconnect structures (including single or dual damascene). Lower-melting point metals such as aluminum and copper tend to be susceptible to electromigration, and are therefore believed to be susceptible to extrusion in damascene interconnect structures. Such extrusion can cause short circuits between interconnect lines, leading to circuit failure.

It would therefore be desirable to develop a damascene process and structure which minimizes extrusion of interconnect metals. In particular, a copper damascene process in which extrusion is minimized while the resistivity benefits of copper are maintained would be desirable.

SUMMARY OF THE INVENTION

The problems outlined above are in large part addressed by formation of a high-melting-point metal cover over interconnects formed from copper or other extrusion-prone metals. To form the improved interconnect using copper, an interlevel dielectric (ILD) is formed over a semiconductor topography, and trenches for interconnects and/or vias are formed in the ILD. A trench liner may then be deposited, followed by copper deposition. Copper deposition is preferably stopped before the trench is completely filled. Any portions of the copper layer and trench liner external to the trenches are subsequently removed, such that copper interconnect portions are formed. A layer of tungsten, or other high-melting-point metal, is subsequently deposited over upper surfaces of the copper and the ILD. Portions of the tungsten layer are then removed to form copper-based interconnects with a tungsten upper portion. A cap or diffusion barrier layer may be deposited over the interconnect layer before depositing an overlying dielectric layer. The overlying dielectric layer could be, for example, an ILD for an additional interconnect level or a final circuit passivation layer.

In a preferred embodiment, an etchback process is used for the removal of copper external to the trench described above. The etchback is continued until the entire upper surface of the copper interconnect is displaced below the upper surface of the ILD. In this way, subsequently deposited tungsten may be polished back to form a planar interconnect structure in which the entire upper surface of each interconnect is formed from tungsten, and this tungsten upper surface is level with the upper surface of the ILD. The resulting interconnect is formed substantially from copper, and is therefore believed to retain the low resistance resulting from the low resistivity of copper. Because the upper surface of the copper is below that of the ILD, the copper is removed from the immediate vicinity of the diffusion path between the ILD and the overlying cap or other dielectric layer. Extrusion of copper between the interconnect lines is therefore believed to be minimized. The tungsten portion of the interconnect is in the vicinity of the interface between the ILD and the overlying layer, but as a high melting-point metal, tungsten is believed to be much less susceptible to extrusion.

In an alternative embodiment, CMP is used to remove portions of the copper layer and the liner deposited external to the trenches. This may result in trenches having copper extending along the trench walls all the way to the tops of the trenches. An optional etchback may then be performed, to lower the entire surface of the copper, as in the embodiment described above. If such an etchback is not done, the subsequently deposited tungsten is largely above the upper surface of the ILD, except for a portion which may dip into the central region of the trench, if the trench is not completely filled with copper. The tungsten layer may be planarized by CMP to form a continuous, flat tungsten layer. The tungsten layer is subsequently patterned and etched so that a tungsten cap is formed over each copper interconnect.

This tungsten cap is believed to reduce extrusion of the copper interconnects in at least two ways. First of all, the copper is believed to be more reactive with the overlying tungsten than with an overlying dielectric layer. The copper atoms are therefore believed to be more likely to become bonded to the tungsten than to diffuse along the interface between the tungsten and the ILD. Secondly, the formation of the conductive tungsten caps alters the electric field distribution between adjacent interconnects. The highest electric field existing between the interconnects is believed to be between the edges of the tungsten cap layers, rather than between the upper edges of the copper interconnect portions, as in a standard damascene process. This altered field distribution may reduce the driving force for copper extrusion.

In addition to the method described above, an interconnect structure is contemplated herein. The interconnect structure is preferably formed primarily from copper. The interconnect structure may be an interconnect line, or a combination of an interconnect line and a via to an underlying portion of the circuit. A copper interconnect structure is arranged within a trench formed in an ILD. A conductive liner is preferably interposed between the copper interconnect structure and the ILD. An interconnect portion formed from tungsten or another high-melting point material is arranged over the upper surface of the copper interconnect portion. In one embodiment, the entire interface between the copper interconnect portion and the tungsten interconnect portion is at an elevation lower than that of the upper surface of the ILD, and the upper surface of the tungsten portion is at the same level as the upper surface of the ILD. In an alternative embodiment, the tungsten interconnect portion extends above the upper surface of the ILD, and extends laterally along the surface of the ILD, outward from the copper interconnect portion. In either of these embodiments, an insulating cap layer may be arranged over upper surfaces of the tungsten portion and the ILD.

BRIEF DESCRIPTION OF THE DRAWINGS

Other objects and advantages of the invention will become apparent upon reading the following detailed description and upon reference to the accompanying drawings in which.

Figure 1:
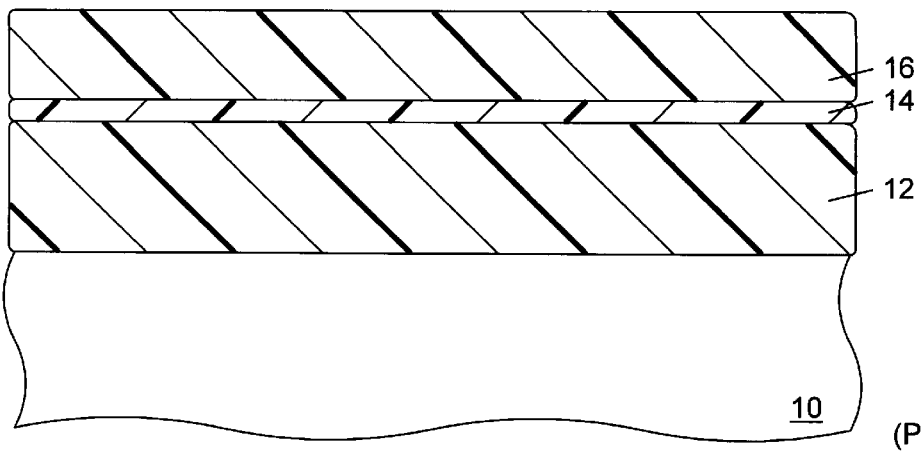
FIG. 1 is a partial cross-sectional view of a semiconductor topography including a semiconductor substrate and an interlevel dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 6:
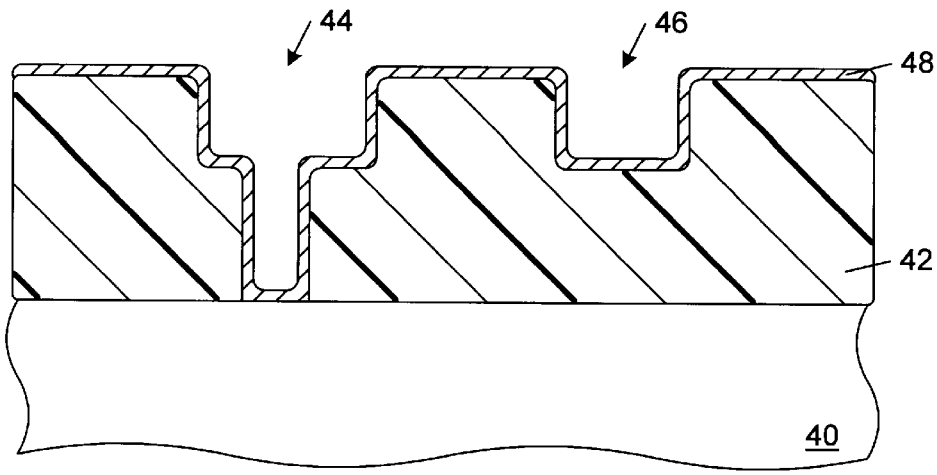
FIG. 6 is a partial cross-sectional view of a semiconductor topography according to the method recited herein, wherein trenches are formed within an interlevel dielectric formed over a semiconductor topography, and a liner is formed on surfaces of the interlevel dielectric.

Turning to the drawings, FIG. 6 illustrates a partial cross-section of trenches 44 and 46 formed within ILD 42 over semiconductor topography 40. As in the case of semiconductor topography 10 in FIG. 1, semiconductor topography 40 includes a semiconductor substrate, preferably a silicon substrate, and may include electronic devices such as transistors and one or more levels of interconnect. ILD 42 may be a single layer of a dielectric, or a stack of dielectric layers such as line dielectric 16, etch stop 14, and via dielectric 12 of FIG. 1. Dielectrics which may be used for ILD 42 include oxide, silicon oxynitride, and/or low-permittivity ("low-K") dielectrics such as fluorinedoped oxide or organic low-K dielectrics. A low-K dielectric is generally considered to be an insulator having a dielectric constant less than about 3.5. ILD 42 is typically deposited using chemical vapor deposition, but other techniques may be used, particularly in the case of organic low-K dielectrics, which may be applied by methods such as spinning on. ILD 42 is preferably deposited by a low-temperature method (substrate temperature less than about 500° C.), to avoid disturbing impurity distributions and/or metallization which may be included in semiconductor topography 40. Plasma-enhanced CVD (PECVD) is a typical low-temperature CVD technique.

Figure 2:
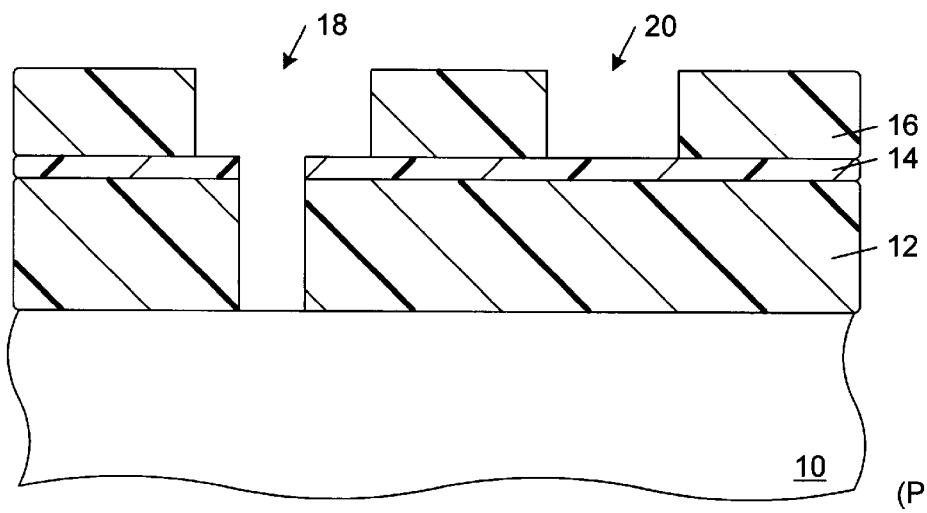
FIG. 2 is a partial cross-sectional view of the semiconductor topography, wherein trenches are formed within the interlevel dielectric, subsequent to the interlevel dielectric formation of FIG. 1.

Trenches 44 and 46 may be formed by photolithographic patterning and etching in a similar manner to trenches 18 and 20 of FIG. 2. For a dual damascene configuration such as that of FIG. 6, the trenches formed may be interconnect line trenches such as trench 46 or combined line and via trenches such as trench 44. The method recited herein may also be applied to single damascene processes, in which trenches having a single depth are formed, for applications including interconnect layer formation or via layer formation. In such a single damascene process, all trenches typically extend through the entire thickness of the ILD. A trench liner such as liner 48 may be deposited over ILD 42 after trench formation. Liner 48 is preferably a conductive material which acts as a barrier to diffusion of the metal filling the trench, and may also promote adhesion of the fill metal to the surfaces of the trench. Suitable liner materials may include refractory metals such as titanium and tantalum, refractory metal nitrides such as TiN and TaN, or refractory metal alloys such as titanium-tungsten. The liner is preferably deposited using a conformal technique so that all exposed trench surfaces are covered. In this way, diffusion of the fill metal into the ILD may be prevented and adhesion to the ILD and the semiconductor topography may be promoted. Suitable deposition methods may include CVD and conformal types of sputtering.

Figure 3:
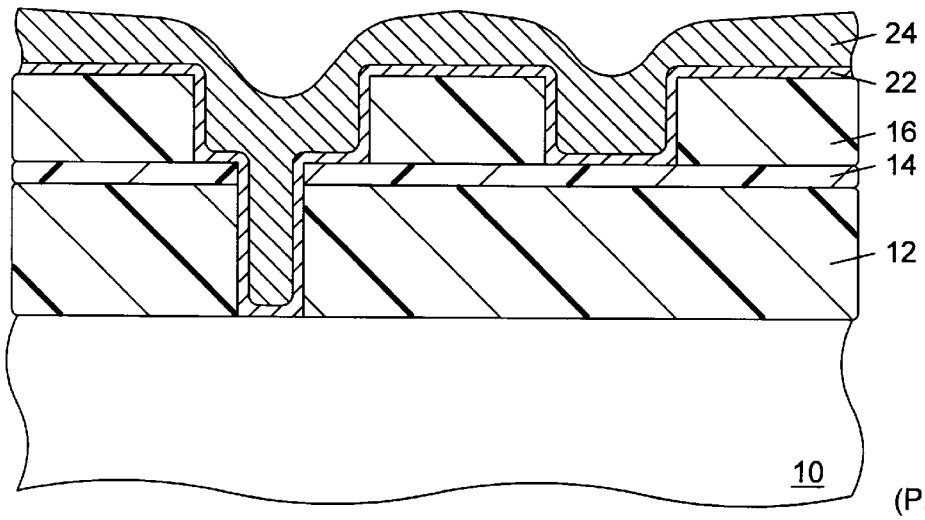
FIG. 3 is a partial cross-sectional view of the semiconductor topography wherein copper is deposited to fill the trenches, subsequent to the trench formation of FIG. 2.
Figure 7:
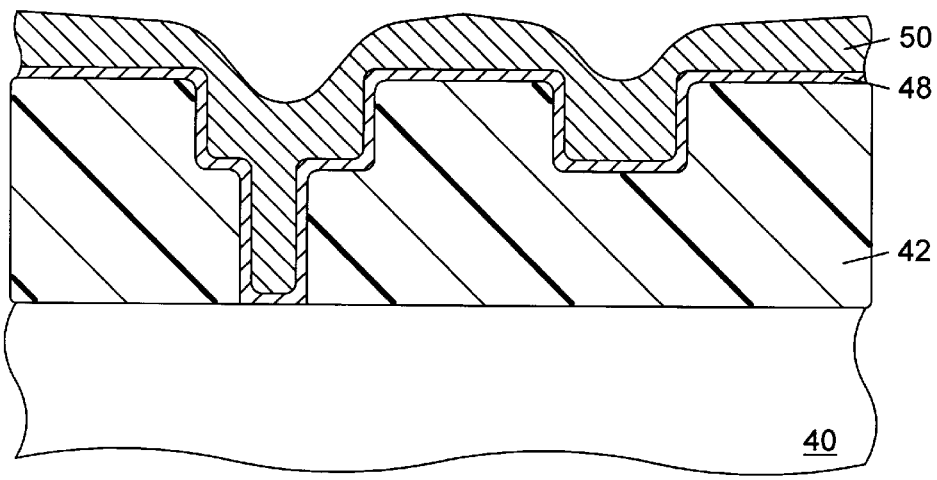
FIG. 7 is a partial cross-sectional view of the semiconductor topography wherein a low-resistance metal is deposited such that the trenches are at least partially filled, subsequent to the trench formation of FIG. 6.

Low-resistance metal 50, preferably copper, is subsequently deposited such that the trenches are at least most of the way filled, as shown in FIG. 7. Trenches 44 and 46 are preferably incompletely filled, such that the upper surface of metal 50 "dips" below the level of the upper surface of ILD 42. This underfilling of the trenches lessens the amount of metal which must be removed during subsequent processing. Metal 50 may also be deposited such that the trenches are filled, however. Deposition of copper for metal 50 is performed in a manner similar to that of copper layer 24 shown in FIG. 3. It should be noted that methods which give a reasonable metal deposition rate, such as electroplating from a deposited seed layer, generally exhibit some degree of conformality. In other words, a complete coverage of metal 50 is formed over all surfaces of the trench, and over the corners at the tops of the trenches. Metal 50 may be formed from a copper alloy or copper containing a small percentage of impurity atoms, rather than from pure copper. Other low-resistance metals may also be used for metal 50, such as aluminum or aluminum alloys. For purposes of this disclosure, low-resistance metals are considered to be metals having resistivity less than about 4 $\mu\Omega$·cm.

Figure 8:
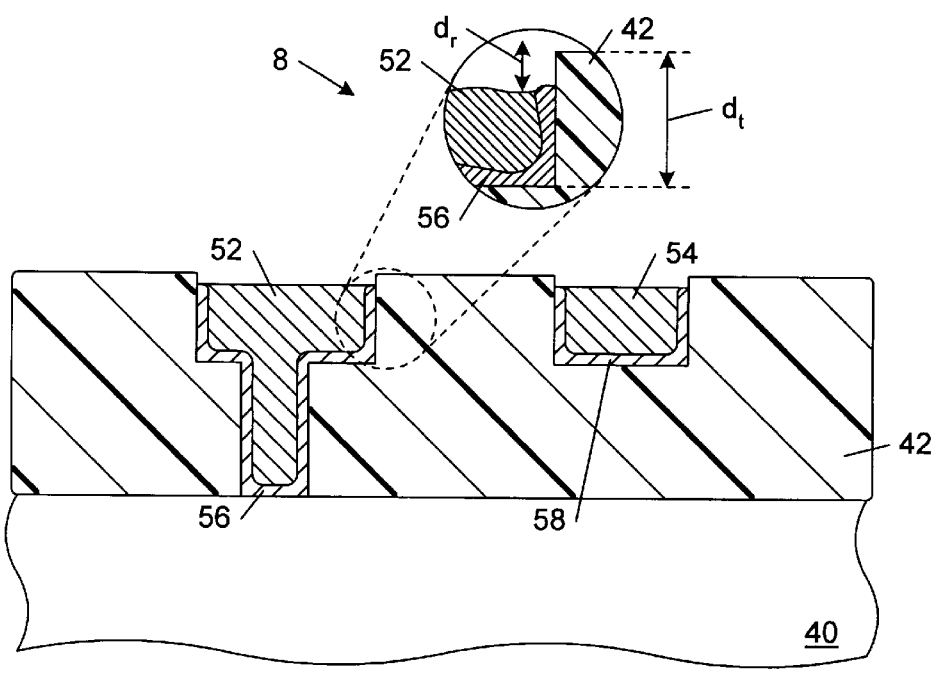
FIG. 8 is a partial cross-sectional view of the semiconductor topography wherein the low-resistance metal is etched back so that the entire upper surfaces of the remaining portions of the metal are below the upper surface of the interlevel dielectric, subsequent to the metal deposition of FIG. 7.

In one embodiment of the method recited herein, shown in FIG. 8, metal layer 50 is etched back such that the entire upper surfaces of the remaining metal portions are recessed below the upper surface of ILD 42. The remaining portions of metal layer 50 form first interconnect portions 52 and 54. An etch which preferentially attacks elevated areas of the topography is useful in achieving the recess of first interconnect portions 52 and 54 into trenches 44 and 46 as shown in FIG. 8. A wet etch solution is believed to be most suitable for the etchback, although a dry etch process tuned to be somewhat isotropic may also be suitable. In an alternative embodiment, a CMP process followed by an etchback may be used to form the topography of FIG. 8. The CMP process removes portions of metal 50 external to the trench, and the subsequent etchback recesses the surfaces of the remaining portions of metal 50 below the upper surface of ILD 42. In still another alternative embodiment, a CMP process alone may result in the topography of FIG. 8, if a sufficiently reactive slurry is used. Slurry may collect in depressed areas of the topography of FIG. 7, such as the areas above trenches 44 and 46. Reaction of the slurry with metal 50 in these areas may cause etching back of the metal within trenches 44 and 46 while portions of metal 50 external to the trenches are removed by the action of the polishing pad in combination with the slurry.

The recess depth $d_r$ between the surface of a lower interconnect portion and the top of the corresponding trench, as shown in expanded view 8 of FIG. 8 for lower interconnect portion 52, is preferably less than about twenty percent of the total line trench depth $d_t$. In this way, the completed interconnect line may be formed largely of low-resistance metal, and retain the advantages associated with low-resistance interconnect lines. Portions of trench liner 48 external to the trenches are also removed, either by the same etchback used to remove portions of metal 50, or by a separate, subsequent removal process. In the embodiment of FIG. 8, all portions of liner 48 not covered by first interconnect portions 56 and 58 are removed. In some embodiments, portions of layer 48 extending between the surfaces of first interconnect portions 52 and 54 and the tops of trenches 44 and 46, respectively, may be retained. For example, this may occur if a CMP process is used to remove portions of liner 48 external to the trench, subsequent to the etchback of metal 50.

Figure 9:
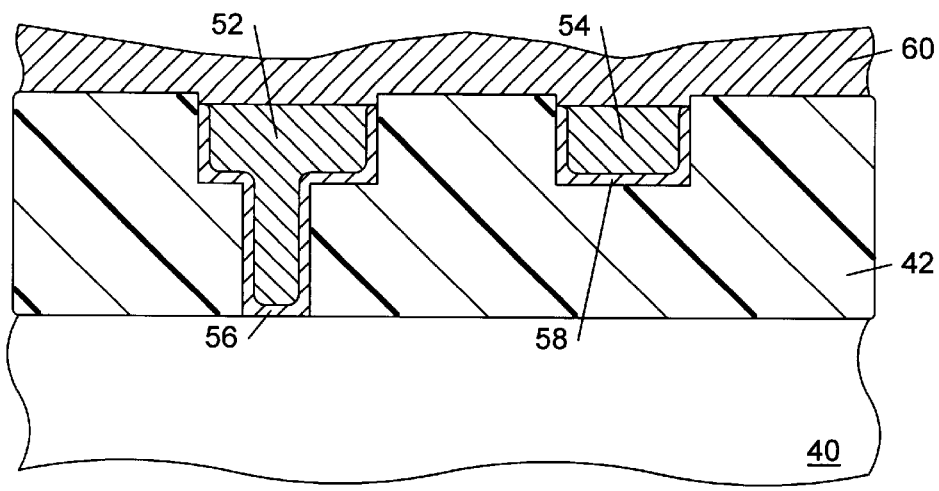
FIG. 9 is a partial cross-sectional view of the semiconductor topography wherein a high-melting-point metal is deposited over upper surfaces of the low-resistance metal and the interlevel dielectric, subsequent to the etchback of FIG. 8.

High-melting point metal 60 is subsequently deposited over upper surfaces of first interconnect portions 52 and 54 and ILD 42, as shown in FIG. 9. Metal 60 is preferably formed from tungsten or a tungsten alloy, but other high-melting-point metals may also be suitable. High-melting-point metals are believed to be less susceptible to extrusion in a damascene interconnect geometry than are lower-melting-point metals such as aluminum or copper. For the purposes of this disclosure, high-melting-point metals are considered to be those with melting points higher than about 1500° C., and preferably higher than about 2000° C. An example of another metal which may be suitable for metal 60 is molybdenum, which has a melting point of about 2600° C., and a relatively low resistivity ranging from about 6 to about 15 micro-ohm·cm. This resistivity is similar to that of tungsten. Molybdenum alloys may also be suitable. High-melting-point metal 60 is typically deposited using a CVD technique, but other methods, such as sputtering, may also be used. Metal 60 is formed thick enough that the remaining portions of trenches 44 and 46 are completely filled. In an alternative embodiment, a conductive adhesion layer may be formed between high-melting-point metal 60 and first interconnect portions 52 and 54. Such an optional adhesion layer is described further in the description of FIG. 13 below.

Figure 4:
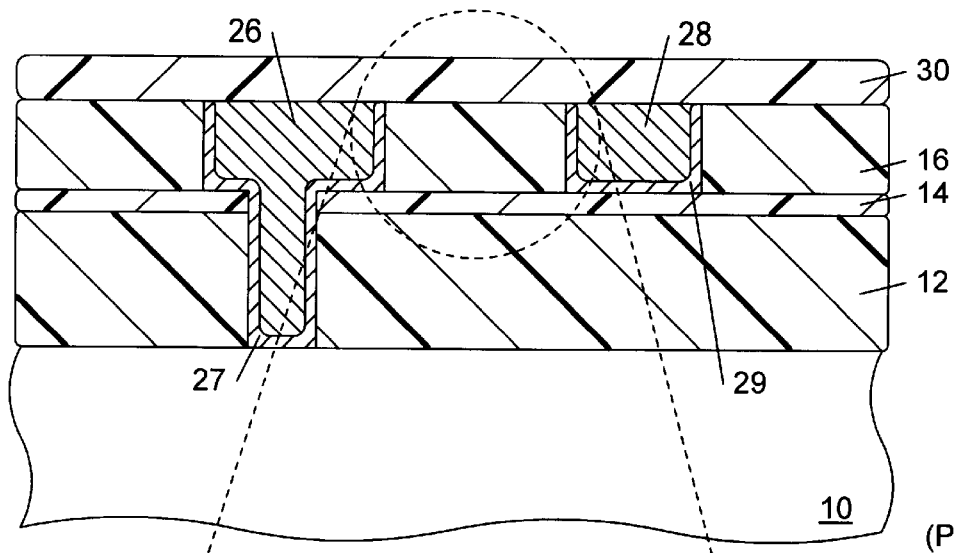
FIG. 4 is a partial cross-sectional view of the semiconductor topography wherein portions of the copper external to the trenches are removed, and a dielectric cap is formed over the resulting interconnects, subsequent to the copper deposition of FIG. 3.
Figure 5:
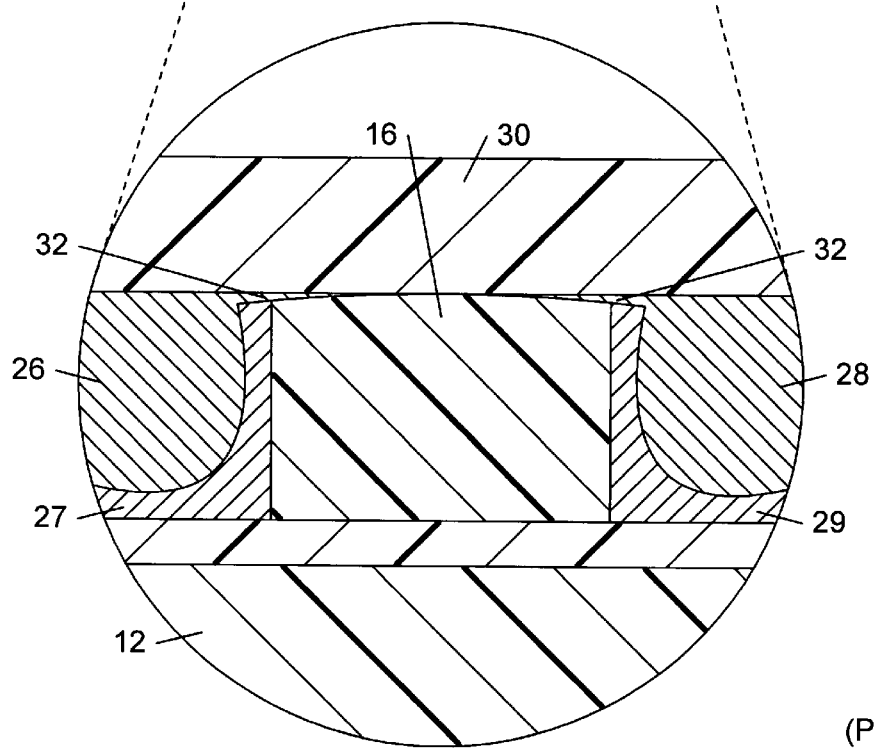
FIG. 5 is an expanded view of a region between the interconnects of FIG. 4, showing copper extrusion along the interface between the cap layer and the interlevel dielectric.
Figure 10:
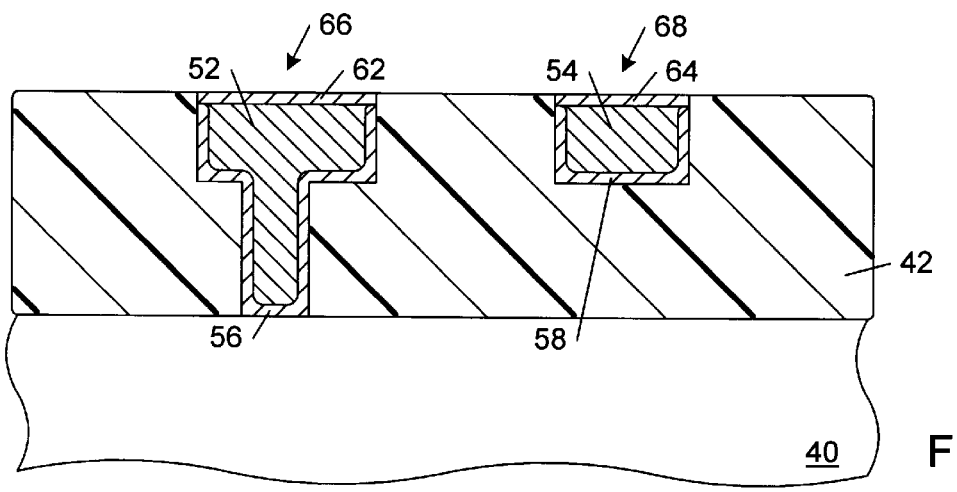
FIG. 10 is a partial cross-sectional view of the semiconductor topography wherein portions of the high-melting-point metal external to the trenches are removed, such that interconnects are formed, subsequent to the metal deposition of FIG. 9.
Figure 11:
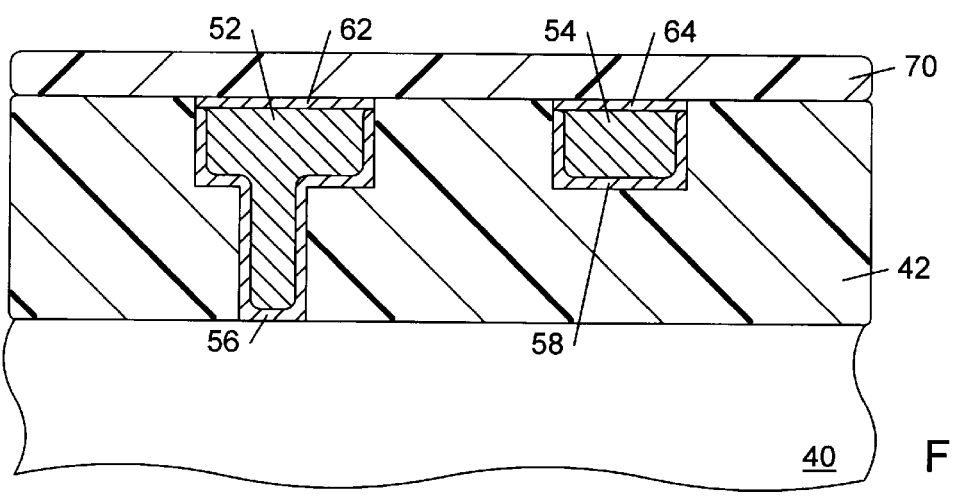
FIG. 11 is a partial cross-sectional view of the semiconductor topography wherein a dielectric is formed over the interconnects and the interlevel dielectric, subsequent to the interconnect formation of FIG. 10.

Portions of metal 60 external to the trenches are subsequently removed, as shown in FIG. 10, to form second interconnect portions 62 and 64. The removal is preferably accomplished using CMP, such that upper surfaces of portions 62 and 64 are at the same elevation as upper surfaces of ILD 42. First interconnect portions 52 and 54 combine with second interconnect portions 62 and 64 to form interconnects 66 and 68, respectively. The topography of FIG. 10 is subsequently covered with dielectric 70, as shown in FIG. 11. Dielectric 70 may have one or more of several functions. For example, dielectric layer 70 may be a cap dielectric, similar to dielectric 30 in FIGS. 4 and 5. Cap dielectric 30 serves as a barrier to prevent copper from interconnects 26 and 28 from diffusing into overlying dielectrics. Because interconnects 66 and 68 have upper portions formed from a high-melting-point metal rather than from copper, use of a diffusion barrier as dielectric 70 may not be necessary. If a diffusion barrier is used, it is formed in a manner similar to cap dielectric 30, from a material such as silicon nitride.

Alternatively, dielectric 70 may be an interlevel dielectric for an overlying interconnect layer. In this case, dielectric 70 is similar in composition and formation to ILD 42. If interconnects 66 and 68 are in the uppermost level of interconnect to be formed on an integrated circuit, dielectric 70 may serve as a final passivation layer. Such a passivation layer is typically formed from silicon nitride or silicon oxynitride, and deposited using a low-temperature CVD process such as PECVD. A multilayer film including silicon nitride, silicon oxynitride, oxide and/or a spin-on glass may also be used to form a final passivation layer.

Regardless of the particular function of dielectric 70, the interface between dielectric 70 and ILD 42 may act as a preferred path for extrusion of metal between interconnects such as 66 and 68 and adjacent interconnects. The interconnect structure of FIG. 11 is believed to minimize such extrusion by removing the copper, or other low-melting-point material, away from this extrusion path. First interconnect portions 52 and 54, containing the low-resistivity metal having a low melting point and believed to be most prone to extrusion, form the lower parts of the interconnects, and are not in contact with the interface between dielectric 70 and ILD 42. Second interconnect portions 62 and 64, which are in contact with the interface, are formed from high-melting-point metals believed to be more extrusion-resistant.

Figure 12:
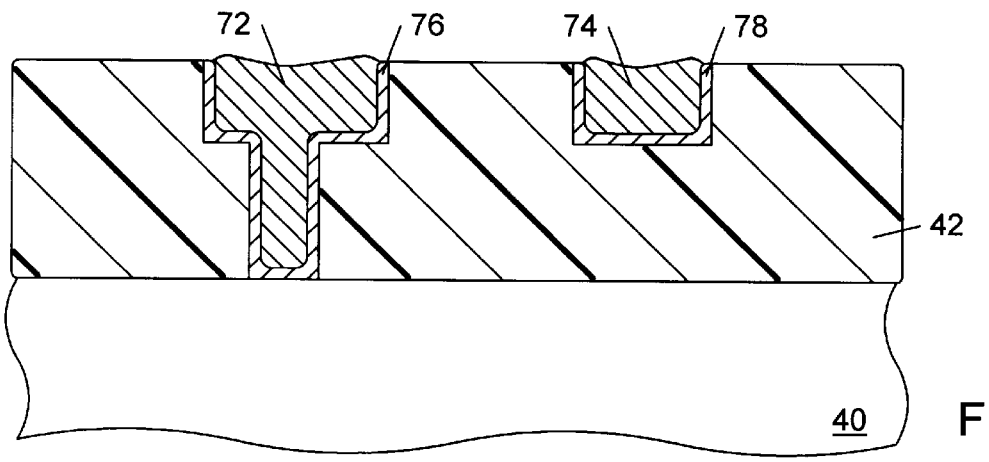
FIG. 12 is a partial cross-sectional view of the semiconductor topography according to an alternative embodiment, wherein portions of the low-resistance metal external to the trenches are removed using CMP, subsequent to the low-resistance metal deposition of FIG. 7.

An alternative embodiment of the method recited herein is illustrated in FIGS. 12–15. Trench formation and low-resistance metal deposition is performed as in FIGS. 6 and 7. Portions of metal 50 external to trenches 44 and 46 are subsequently removed using a CMP method, such that first interconnect portions 72 and 74 are formed, as shown in FIG. 12. CMP of copper may be performed using commercially available equipment, such as the AvantGaard 776 model CMP tool manufactured by Integrated Process Equipment Corporation (IPEC). In the embodiment of FIG. 12, a CMP process is used which does not result in appreciable etching of the metal within the trenches. Because of the conformality of the method used to deposit low-resistance metal 50 (shown in FIG. 7), the metal extends up and over the sides of the trench even when the center of the trench is underfilled. First interconnect portions 72 and 74 of FIG. 12 therefore extend up to the elevation of the upper surface of ILD 42, at least at the edges of the trenches. Exposed portions of liner 48 are also removed, leaving liner portions 76 and 78 underlying first interconnect portions 72 and 74.

Figure 13:
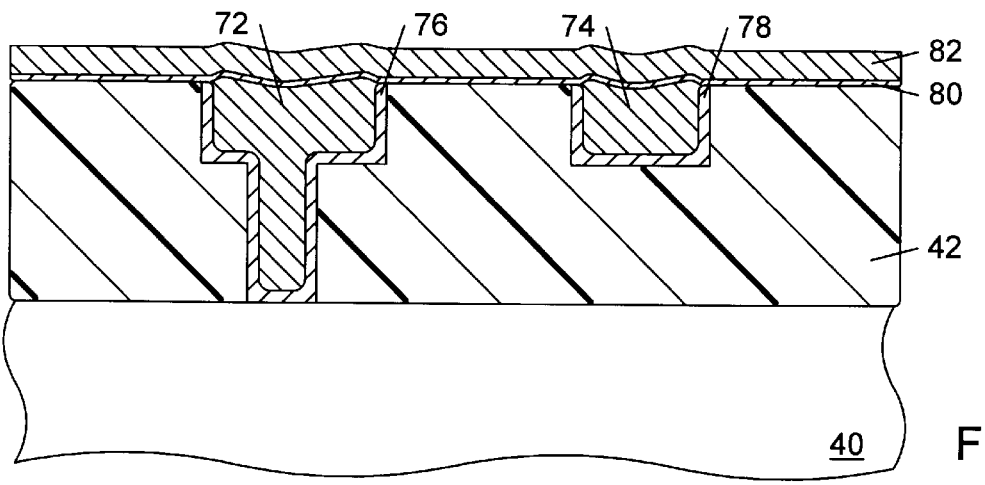
FIG. 13 is a partial cross-sectional view of the semiconductor topography wherein a high-melting-point metal is deposited, subsequent to the metal removal of FIG. 12.

High-melting-point metal 82 is subsequently deposited over upper surfaces of interconnect portions 72 and 74 and ILD 42, as shown in FIG. 13. Metal 82 is similar in composition and deposition to high-melting-point metal 60 of FIG. 9. In the embodiment of FIG. 13, conductive adhesion layer 80 is deposited before deposition of metal 82. Adhesion layer 80 may improve adhesion between high-melting-point metal 82 and the underlying metal and dielectric regions. This may be particularly useful in embodiments for which metal 82 is tungsten, since tungsten is known to not adhere well to some dielectrics, such as oxide. Adhesion layer 80 may be formed from materials including refractory metals, refractory metal nitrides, and/or refractory metal alloys. Titanium and/or titanium alloys and compounds may be particularly suitable for adhesion layer 80.

Figure 14:
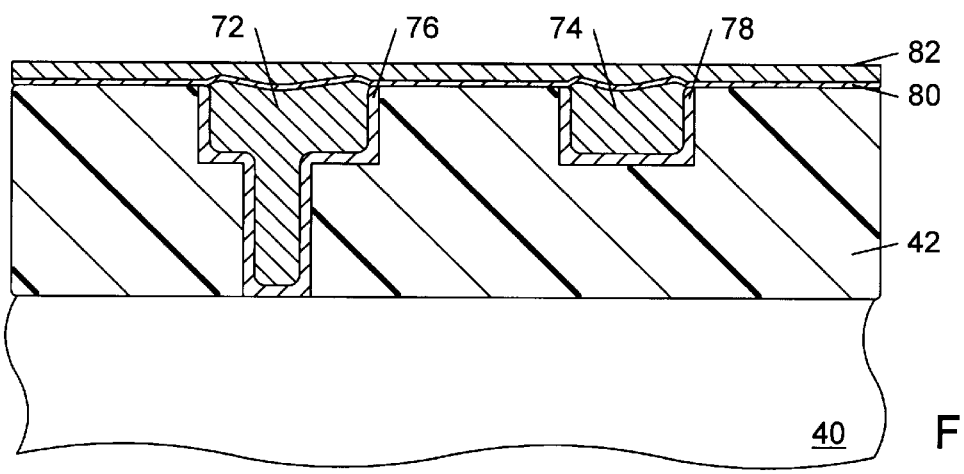
FIG. 14 is a partial cross-sectional view of the semiconductor topography wherein the high-melting-point metal layer is planarized, subsequent to the metal deposition of FIG. 13.
Figure 15:
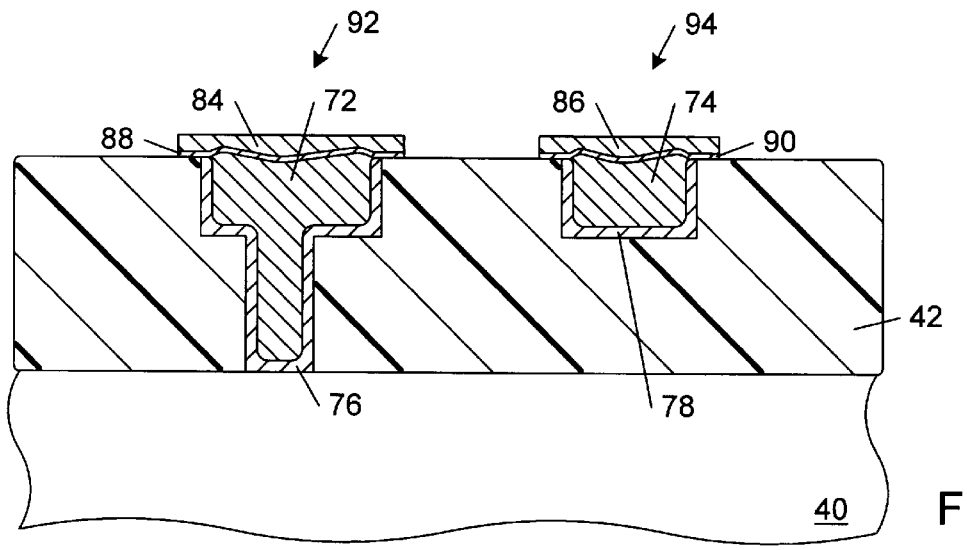
FIG. 15 is a partial cross-sectional view of the semiconductor topography wherein the high-melting-point metal layer is patterned such that interconnects are formed, subsequent to the planarization of FIG. 14.

Turning now to FIG. 14, an optional planarization of metal 82 may be performed. This planarization is preferably performed using CMP. Because edge areas of first interconnect portions 72 and 74 extend to the elevation of the surface of ILD 42, second interconnect portions which cover these first interconnect portions cannot be formed by polishing metal 82 all the way down to the surface of ILD 42. The polishing of FIG. 14 therefore does not remove all portions of metal 82 external to the trenches, but may produce a flat surface which is amenable to a subsequent patterning process. Such a patterning process and a subsequent etch are used to form second interconnect portions 84 and 86, as shown in FIG. 15. Portions of adhesion layer 80 not covered by interconnect portions 84 and 86 are removed to form adhesion layer portions 88 and 90. Second interconnect portions 84 and 86 combine with first interconnect portions 72 and 74 and adhesion layer portions 88 and 90 to form interconnects 92 and 94, respectively. The topography of FIG. 15 may subsequently be covered with a dielectric similar to dielectric 70 of FIG. 11. This overlying dielectric may be planarized using CMP, particularly if an additional interconnect level is to be formed over the level containing interconnects 92 and 94.

Like the structure of FIG. 11, the interconnect structure of FIG. 15 is also believed to be resistant to extrusion, but for different reasons. Unlike for the structure of FIG. 11, first interconnect portions 72 and 74 are in contact with the interface between ILD 42 and any overlying layers. But because the layer overlying ILD 42 in the immediate vicinity of first interconnect portions 72 and 74 is a conductive adhesion layer (88 or 90) or a high-melting-point metal (84 or 86), extrusion of the low-resistance metal is believed to be minimized. In particular, the low resistance metal forming portions 72 and 74 is believed to be more likely to bond to the overlying metal or metal compound forming portions 88 and 90 or 84 and 86 (if the adhesion layer is omitted) than to diffuse along the interface with this metal or metal compound. In addition, the extension of second interconnect portions 84 and 86 outward from first interconnect portions 72 and 74 is believed to alter the electric field distribution between adjacent interconnects such that the maximum electric field is not in the portions of interconnects 92 and 94 containing extrusion-prone low-resistance metals.

It will be appreciated to those skilled in the art having the benefit of this disclosure that this invention is believed to provide a low-resistance interconnect in which short circuits between adjacent interconnects caused by extrusion are minimized, and a method for forming this interconnect. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An interconnect structure, comprising:
   a first interconnect portion comprising a low-resistance metal having an upper surface substantially coplanar with an upper surface of an interlevel dielectric; and
   a second interconnect portion comprising a high-melting point metal arranged upon the upper surface of the first interconnect portion, wherein the second interconnect portion extends laterally from the upper surface of the first interconnect portion and extends along a portion of the upper surface of the interlevel dielectric, and wherein the entirety of an upper surface of the second interconnect portion is substantially parallel to the upper surface of the interlevel dielectric.

2. The interconnect structure as recited in claim 1, wherein the low-resistance metal includes any metal having a resistivity less than about 4.0 micro-ohm centimeters.

3. The interconnect structure as recited in claim 1, wherein said first interconnect portion comprises copper or a copper alloy.

4. The interconnect structure as recited in claim 1, wherein the high-melting-point metal includes any metal having a melting point higher than about 2000° C.

5. The interconnect structure as recited in claim 1, wherein said second interconnect portion comprises tungsten or a tungsten alloy.

6. The interconnect structure as recited in claim 1, wherein said second interconnect portion comprises molybdenum or a molybdenum alloy.

7. An interconnect structure, comprising:
   a first interconnect portion comprising a low-resistance metal having an upper surface recessed below an upper surface of an interlevel dielectric;
   a conductive liner interposed between the first interconnect portion and the interlevel dielectric, wherein an uppermost extent of the conductive liner is substantially even with the upper surface of the first interconnect portion;
   a second interconnect portion comprising a high-melting point metal arranged above the upper surface of the first interconnect portion; and
   a conductive adhesion layer interposed along the entirety of an interface between the first interconnect portion and the second interconnect portion.

8. The interconnect structure as recited in claim 7, wherein an upper surface of the second interconnect portion is substantially coplanar with the upper surface of the interlevel dielectric.

9. The interconnect structure as recited in claim 7, wherein the first and second interconnect portions are bounded entirely within a trench that extends downward into said interlevel dielectric.

10. The interconnect structure as recited in claim 7, wherein said conductive liner comprises a refractory metal, a refractory metal nitride, or a refractory metal alloy.

11. The interconnect structure as recited in claim 1, farther comprising a conductive adhesion layer interposed between the first interconnect portion and the second interconnect portion.

12. The interconnect structure as recited in claim 11, wherein said conductive adhesion layer comprises a refractory metal, a refractory metal nitride, or a refractory metal alloy.

13. The interconnect structure as recited in claim 1, further comprising a cap dielectric covering upper surfaces of the second interconnect portion and the interlevel dielectric.

14. The interconnect structure as recited in claim 13, wherein said cap dielectric comprises silicon nitride.

15. The interconnect structure as recited in claim 7, wherein said conductive adhesion layer comprises a refractory metal, a refractory metal nitride, or a refractory metal alloy.

16. The interconnect structure as recited in claim 7, wherein the low-resistance metal includes any metal having a resistivity less than about 4.0 micro-ohm centimeters.

17. The interconnect structure as recited in claim 7, wherein said first interconnect portion comprises copper or a copper alloy.

18. The interconnect structure as recited in claim 7, wherein the high-melting-point metal includes any metal having a melting point higher than about 2000° C.

19. The interconnect structure as recited in claim 7, wherein said second interconnect portion comprises tungsten or a tungsten alloy.

20. The interconnect structure as recited in claim 7, wherein said second interconnect portion comprises molybdenum or a molybdenum alloy.

* * * * *

UNITED STATES PATENT AND TRADEMARK OFFICE
CERTIFICATE OF CORRECTION

PATENT NO. : 6,157,081
DATED : December 5, 2000
INVENTOR(S) : Nariman, et. al.

It is certified that error appears in the above-identified patent and that said Letters Patent is hereby corrected as shown below:

Claim 11, col. 12, line 25, after the phrase "as recited in claim 1," delete "farther" and substitute therefor --further--

Signed and Sealed this

First Day of May, 2001

Attest:

NICHOLAS P. GODICI

Attesting Officer     Acting Director of the United States Patent and Trademark Office